United States Patent
Bloom

(10) Patent No.: US 9,411,779 B2
(45) Date of Patent: Aug. 9, 2016

(54) METHOD OF DISPENSING MATERIAL BASED ON EDGE DETECTION

(71) Applicant: Jonathan Joel Bloom, North Falmouth, MA (US)

(72) Inventor: Jonathan Joel Bloom, North Falmouth, MA (US)

(73) Assignee: Illinois Tool Works Inc., Glenview, IL (US)

( * ) Notice: Subject to any disclaimer, the term of this patent is extended or adjusted under 35 U.S.C. 154(b) by 918 days.

(21) Appl. No.: 13/630,139

(22) Filed: Sep. 28, 2012

(65) Prior Publication Data
US 2014/0094963 A1     Apr. 3, 2014

(51) Int. Cl.
| | | |
|---|---|---|
| *B05D 5/12* | (2006.01) | |
| *G06F 17/00* | (2006.01) | |
| *H05K 3/00* | (2006.01) | |
| *H05K 13/04* | (2006.01) | |
| *G06T 7/00* | (2006.01) | |

(52) U.S. Cl.
CPC .............. *G06F 17/00* (2013.01); *G06T 7/0004* (2013.01); *G06T 7/0042* (2013.01); *H05K 3/0008* (2013.01); *H05K 13/0469* (2013.01); *G06T 2207/30141* (2013.01); *H05K 2203/0126* (2013.01)

(58) Field of Classification Search
USPC ................................ 427/8–10, 98.4; 700/231
See application file for complete search history.

(56) References Cited

U.S. PATENT DOCUMENTS

| | | | |
|---|---|---|---|
| 5,044,900 A | | 9/1991 | Cavallaro |
| 5,557,690 A | * | 9/1996 | O'Gorman ........... G06K 9/3216 348/87 |
| 5,795,390 A | | 8/1998 | Cavallaro |
| 5,819,983 A | | 10/1998 | White et al. |
| 5,837,892 A | | 11/1998 | Cavallaro et al. |

(Continued)

FOREIGN PATENT DOCUMENTS

JP    H03 288279 A    12/1991

OTHER PUBLICATIONS

Notification of Transmittal of the International Search Report and the Written Opinion of the International Searching Authority from corresponding PCT/US2013/059882 mailed Feb. 6, 2014.

*Primary Examiner* — Brian K Talbot
(74) *Attorney, Agent, or Firm* — Lando & Anastasi, LLP

(57) ABSTRACT

A dispensing system for depositing material on an electronic substrate includes a frame, a dispensing unit gantry movably coupled to the frame, a dispensing unit coupled to the dispensing unit gantry, a vision system gantry coupled to the frame, and a vision system coupled to the vision system gantry. A controller is configured to manipulate the vision system with the vision gantry system to move to the position defined by a feature, to acquire an image of at least a portion of a feature, to search for an edge of interest along a center of the image, and to return a value indicating an offset of zero (0), which is interpreted as the location that is exactly as expected, and an offset that reflects where the edge of interest intersected that axis location.

3 Claims, 10 Drawing Sheets

(56) References Cited

U.S. PATENT DOCUMENTS

| | | | |
|---|---|---|---|
| 5,886,494 A | 3/1999 | Prentice et al. | |
| 5,903,125 A | 5/1999 | Prentice et al. | |
| 5,918,648 A | 7/1999 | Carr et al. | |
| 5,957,343 A | 9/1999 | Cavallaro | |
| 5,971,227 A | 10/1999 | White et al. | |
| 5,985,029 A | 11/1999 | Purcell | |
| 6,007,631 A | 12/1999 | Prentice et al. | |
| 6,017,392 A | 1/2000 | Cavallaro | |
| 6,025,689 A | 2/2000 | Prentice et al. | |
| 6,056,190 A | 5/2000 | Foulke et al. | |
| 6,082,289 A | 7/2000 | Cavallaro | |
| 6,085,943 A | 7/2000 | Cavallaro et al. | |
| 6,093,251 A | 7/2000 | Carr et al. | |
| 6,112,588 A | 9/2000 | Cavallaro et al. | |
| 6,119,895 A | 9/2000 | Fugere et al. | |
| 6,157,157 A | 12/2000 | Prentice et al. | |
| 6,170,737 B1 | 1/2001 | Foulke et al. | |
| 6,206,964 B1 * | 3/2001 | Purcell | H01L 21/6715 118/313 |
| 6,214,117 B1 | 4/2001 | Prentice et al. | |
| 6,216,917 B1 | 4/2001 | Crouch | |
| 6,224,671 B1 | 5/2001 | Cavallaro | |
| 6,224,675 B1 | 5/2001 | Prentice et al. | |
| 6,258,165 B1 | 7/2001 | Cavallaro | |
| 6,322,854 B1 | 11/2001 | Purcell et al. | |
| 6,371,339 B1 | 4/2002 | White et al. | |
| 6,378,737 B1 | 4/2002 | Cavallaro et al. | |
| 6,391,378 B1 | 5/2002 | Carr et al. | |
| 6,395,334 B1 | 5/2002 | Prentice et al. | |
| 6,412,328 B1 | 7/2002 | Cavallaro et al. | |
| 6,427,903 B1 | 8/2002 | Foulke et al. | |
| 6,444,035 B1 | 9/2002 | Nowak et al. | |
| 6,514,569 B1 | 2/2003 | Crouch | |
| 6,540,832 B2 | 4/2003 | Cavallaro | |
| 6,541,063 B1 * | 4/2003 | Prentice | H05K 13/0469 118/323 |
| 6,641,030 B1 | 11/2003 | Freeman et al. | |
| 6,644,238 B2 | 11/2003 | Watts et al. | |
| 6,688,458 B2 | 2/2004 | Prentice et al. | |
| 6,739,483 B2 | 5/2004 | White et al. | |
| 6,775,879 B2 | 8/2004 | Bibeault et al. | |
| 6,814,810 B2 | 11/2004 | Prentice et al. | |
| 6,866,881 B2 | 3/2005 | Prentice et al. | |
| 6,902,052 B2 | 6/2005 | Prentice et al. | |
| 6,932,280 B2 | 8/2005 | Crouch | |
| 7,404,861 B2 | 7/2008 | Prentice et al. | |
| 7,833,572 B2 * | 11/2010 | Read | H01L 21/6715 118/305 |
| 7,923,056 B2 | 4/2011 | Read | |
| 7,980,197 B2 | 7/2011 | Prentice et al. | |
| 8,136,705 B2 | 3/2012 | Tracy et al. | |
| 8,230,805 B2 * | 7/2012 | Read | H05K 13/0469 118/313 |
| 8,424,720 B2 | 4/2013 | Tracy et al. | |
| 8,616,042 B2 * | 12/2013 | Tracy | B05C 5/0225 73/1.36 |
| 9,057,642 B2 * | 6/2015 | Bloom | H05K 13/0469 |
| 2003/0066734 A1 * | 4/2003 | Prentice | B65G 21/10 198/346.1 |
| 2003/0209560 A1 | 11/2003 | Hui et al. | |
| 2005/0244569 A1 * | 11/2005 | Estelle | B05B 12/122 427/8 |
| 2006/0193969 A1 * | 8/2006 | Prentice | B05C 5/0233 427/8 |
| 2008/0159617 A1 | 7/2008 | Yang et al. | |
| 2008/0296311 A1 * | 12/2008 | Read | H05K 13/0469 221/1 |
| 2012/0240658 A1 | 9/2012 | Tracy | |
| 2013/0089657 A1 * | 4/2013 | McComiskey | B05C 11/1015 427/8 |
| 2013/0133574 A1 | 5/2013 | Doyle et al. | |
| 2013/0136850 A1 | 5/2013 | Doyle et al. | |
| 2013/0177702 A1 | 7/2013 | Crouch et al. | |

* cited by examiner

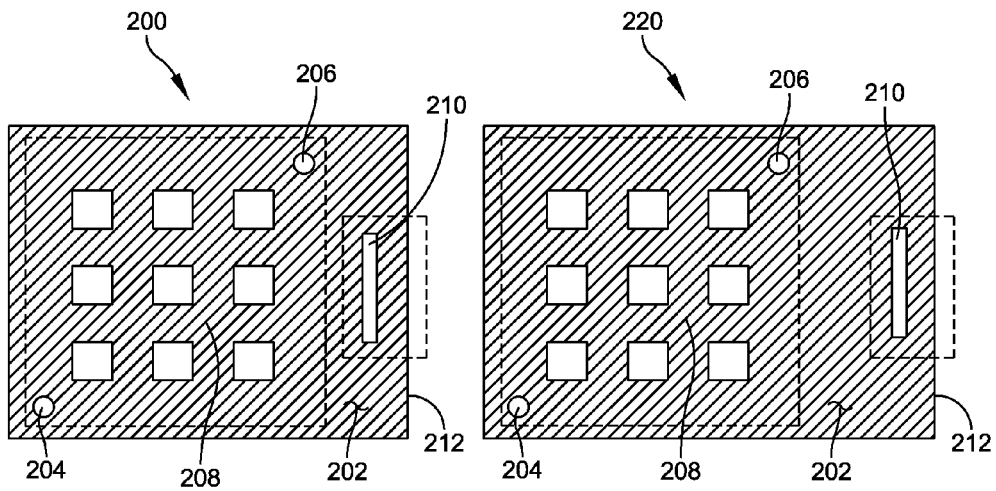
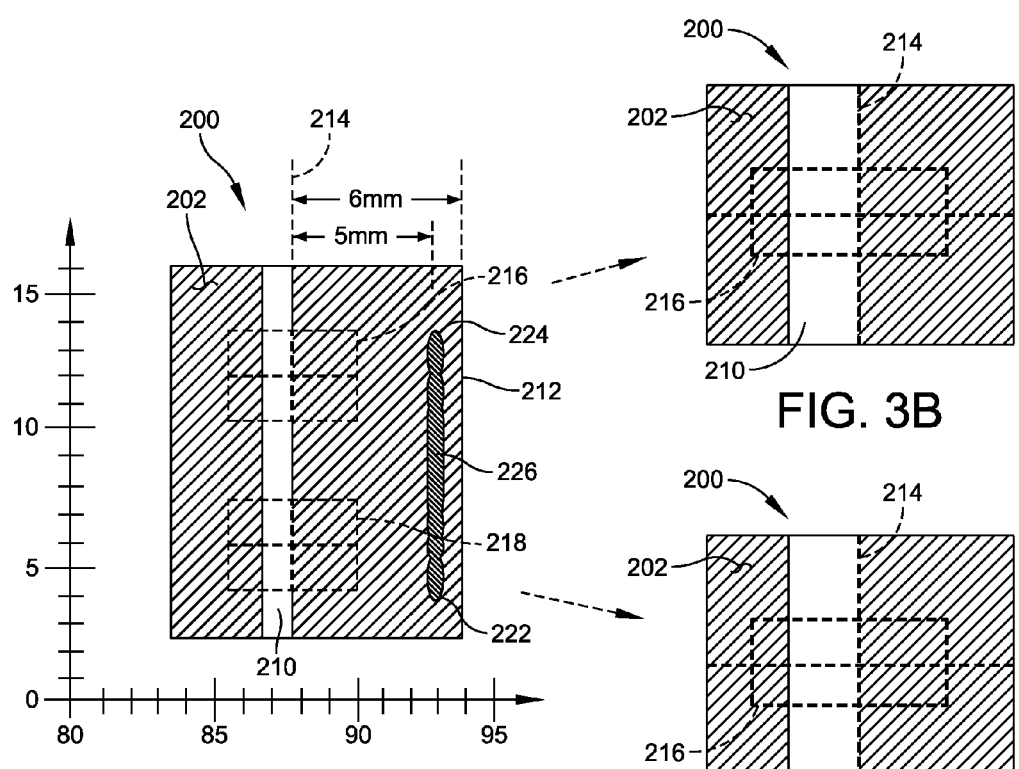

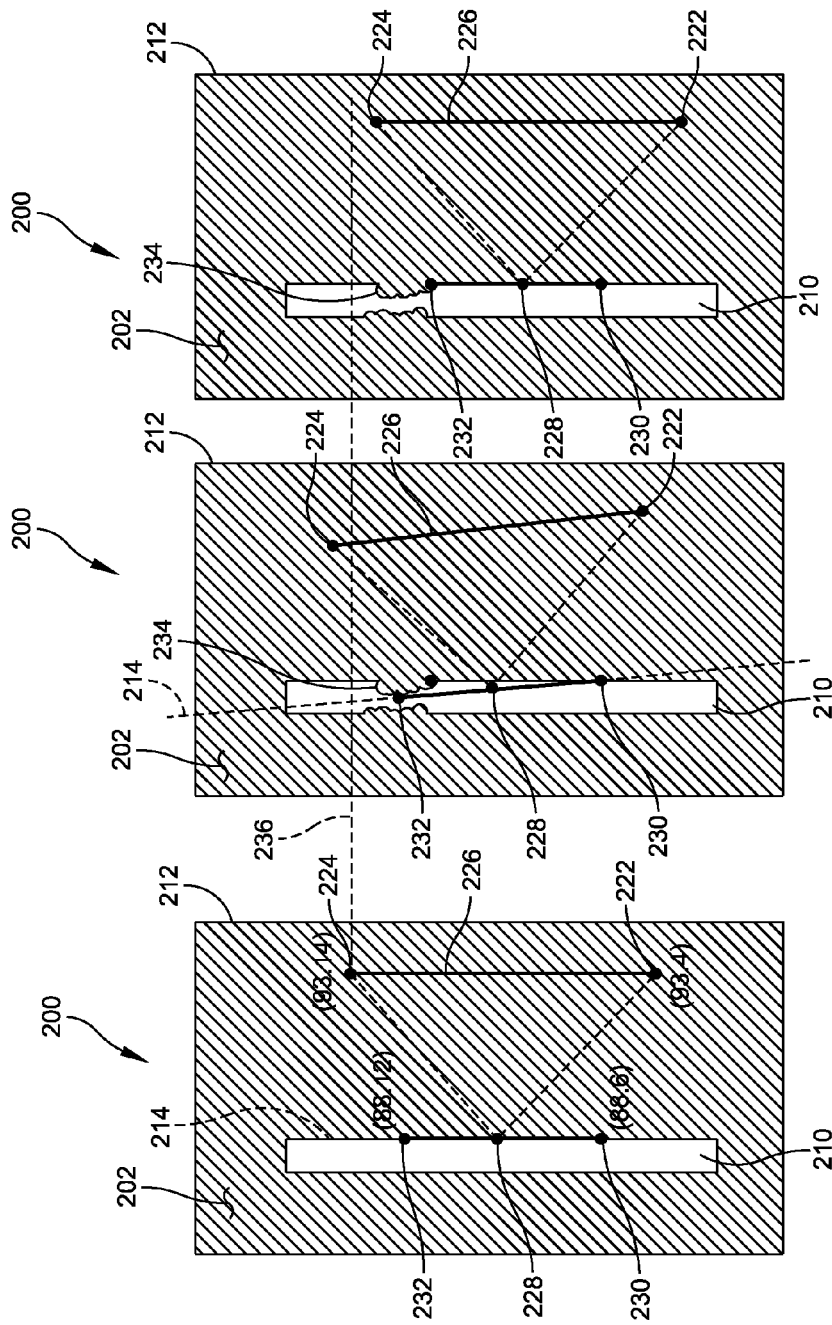

METHOD OF DISPENSING MATERIAL BASED ON EDGE DETECTION

BACKGROUND OF THE DISCLOSURE

1. Field of the Disclosure

This disclosure relates generally to apparatus and methods for dispensing a viscous material on a substrate, such as a printed circuit board, and more particularly to a system and related methods for accurately dispensing material on a circuit board based on detecting an edge of the circuit board.

2. Discussion of Related Art

There are several types of prior art dispensing systems used for dispensing precise amounts of liquid or paste for a variety of applications. One such application is the assembly of integrated circuit chips and other electronic components onto circuit board substrates. In this application, automated dispensing systems are used for dispensing very small amounts, or dots, of viscous material onto a circuit board. The viscous material may include liquid epoxy or solder paste, or some other related material. Prior to performing a dispensing operation, the circuit board must be aligned or otherwise registered with a dispenser of the dispensing system. In one known method, this may be achieved by employing a vision system of the dispensing system to verify the location of landmarks, otherwise known as fiducials, on the circuit board. Specifically, to align the circuit board with the dispensing unit of the dispensing system, images of at least two fiducials are taken by a camera of the vision system. If the circuit board is out of position, a gantry capable of moving the dispenser may be manipulated to account for the actual position of the circuit board. In another embodiment, a support surface upon which the circuit board rests may be manipulated to accurately position the circuit board prior to performing a dispense operation.

One issue associated with the use of identifying fiducials to align the circuit board with the dispensing unit is when the area requiring dispensing is not well defined with reference to the fiducials. For example, if the area to dispense is not referenced with respect to the fiducials, the resulting dispense operation may be very inaccurate, and under many instances, may not meet the processing requirements.

SUMMARY OF THE DISCLOSURE

The present disclosure describes a technique of dispensing material without the use of fiducials or other target objects by locating an edge or edges of the substrate and using the edge to orient a dispensing unit of a dispenser relative to the found edge.

This technique includes the ability to accurately dispense a line of material located on an edge of a substrate. After finding an edge with one or more measurement locations, a specified dispense location is adjusted relative to the found edge. While the dispensed edge is normally parallel to the edge, parallel dispensing is not required. The start and the end locations of the dispensed line of material by using this technique is less critical than the length of the line dispensed, which may be adjusted.

This technique further includes the ability to accurately dispense a line of material onto a substrate by using two different edges. By finding two different edges, the method includes dispensing at a location that is relative to the two edges.

This technique further includes the ability to accurately dispense dots or line segments located on an edge of a substrate.

This technique further includes the ability to measure the edges in a single camera field of view or in different fields of view.

This technique further includes the ability to dispense non-straight edges on an edge of a substrate with additional measurement locations and/or dimensional information about the edge or other feature of the substrate.

One aspect of the present disclosure is directed to a dispensing system for depositing material on an electronic substrate. In one embodiment, the dispensing system includes a frame, a dispensing unit gantry movably coupled to the frame, and a dispensing unit coupled to the dispensing unit gantry. The dispensing unit is configured to deposit material onto the substrate during the dispense operation. The dispensing system further includes a vision system gantry coupled to the frame and a vision system coupled to the vision system gantry. The vision system is configured to obtain one or more images of the electronic substrate prior to performing the dispense operation. A controller is coupled to the dispensing unit gantry, the dispensing unit, the vision system gantry, and the vision system. The controller is configured to manipulate the vision system with the vision gantry system to move to the position defined by a feature, to acquire an image of at least a portion of a feature, to search for an edge of interest along a center of the image, and to return a value indicating an offset of zero (0), which is interpreted as the location that is exactly as expected, and an offset that reflects where the edge of interest intersected that axis location.

Embodiments of the dispensing system further may include a support assembly coupled to the frame. The support assembly may be configured to support the electronic substrate during a dispense operation. In one embodiment, the controller further may be configured to manipulate the vision system with the vision gantry system to move to the position defined by a vertical feature and to acquire the image, and if searching for a vertical edge or edges, then search for the edge of interest along the center row of the image, and return a value indicating a y-axis offset of zero (0), which is interpreted as the y-axis location that is exactly as expected, and an x-axis offset that reflects where the edge of interest intersected that y-axis location. The controller further may be configured to manipulate the vision system with the vision gantry system to move to the position defined by a horizontal feature and to acquire the image, and if searching for a horizontal edge or edges, then search for the edge of interest along the center column of the image, and return a value indicating a x-axis offset of zero (0), which is interpreted as the x-axis location that is exactly as expected, and an y-axis offset that reflects where the edge of interest intersected that x-axis location. The feature may be is consistent or inconsistent. The controller further may be configured to adjust an edge point to find a consistent portion of the feature.

Another aspect of the disclosure is directed to a method of depositing material on an electronic substrate with a dispensing system of the type including a frame, a dispensing unit gantry movably coupled to the frame, a dispensing unit coupled to the dispensing unit gantry, the dispensing unit being configured to deposit material onto the substrate during the dispense operation, a vision system gantry coupled to the frame, and a vision system coupled to the vision system gantry, the vision system being configured to obtain one or more images of the electronic substrate prior to performing the dispense operation. In one embodiment, the method comprises: manipulating the vision system with the vision gantry system to move to the position defined by a feature; acquiring an image of at least a portion of a feature, to search for an edge of interest along a center of the image; and returning a value indicating an offset of zero (0), which is interpreted as the location that is exactly as expected, and an offset that reflects where the edge of interest intersected that axis location.

Embodiments of the method further may include, for a vertical feature, manipulating the vision system with the vision gantry system to move to the position defined by the vertical feature and to acquire the image, and if searching for a vertical edge or edges, then search for the edge of interest along the center row of the image, and return a value indicating a y-axis offset of zero (0), which is interpreted as the y-axis location that is exactly as expected, and an x-axis offset that reflects where the edge of interest intersected that y-axis location. For a horizontal feature, the method further may include manipulating the vision system with the vision gantry system to move to the position defined by a horizontal feature and to acquire the image, and if searching for a horizontal edge or edges, then search for the edge of interest along the center column of the image, and return a value indicating a x-axis offset of zero (0), which is interpreted as the x-axis location that is exactly as expected, and an y-axis offset that reflects where the edge of interest intersected that x-axis location. The feature may be consistent or inconsistent. The method further may include adjusting an edge point to find a consistent portion of the feature.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 2A and 2B are top plan views of exemplary electronic substrates;

FIGS. 3A, 3B and 3C are enlarged top plan views of portions of the electronic substrate shown in FIG. 2A;

FIGS. 6A, 6B and 6C are enlarged top plan views of a portion of the electronic substrate illustrated in FIG. 3A showing a degraded feature of an exemplary electronic substrate;

DETAILED DESCRIPTION OF THE DISCLOSURE

Figure 1:
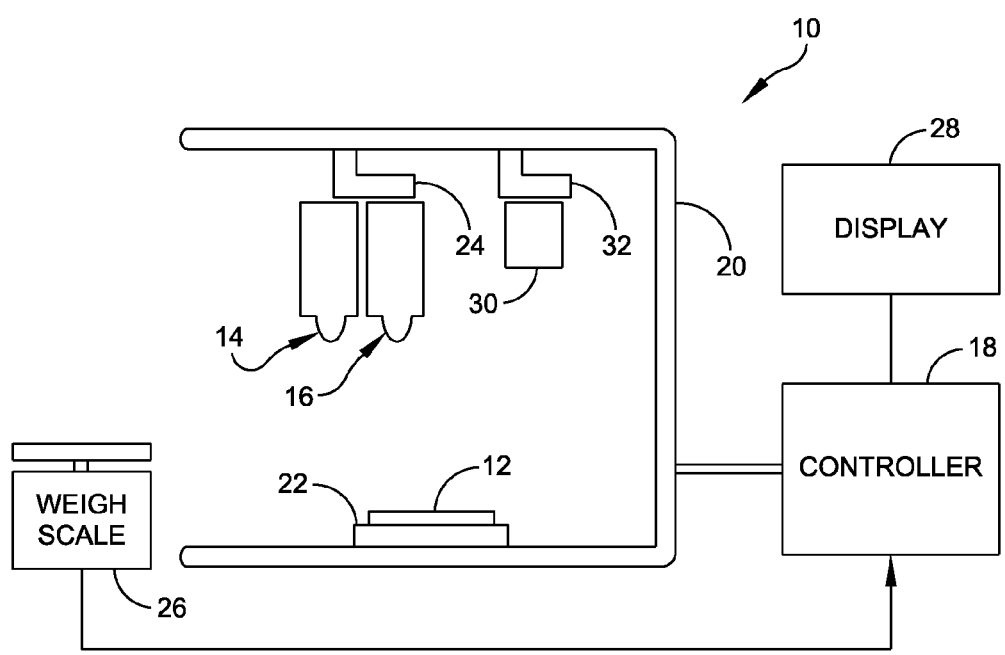
FIG. 1 is a schematic view of a dispenser of an embodiment of the present disclosure.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Various embodiments of the present disclosure are directed to viscous material dispensing systems, devices including dispensing systems, and methods of aligning dispensers with substrates, such as printed circuit boards. Embodiments disclosed herein are directed to techniques for dispensing material on an electronic substrate without the use of fiducials by locating one or more edges of the electronic substrate, and using the location(s) of the edge(s) to orient a dispensing unit or pump of the dispensing system to enhance a dispense operation.

The systems and methods further enable the accurate dispense of a line located along the edge of the electronic substrate. Specifically, after finding an edge using one or more measurement locations, the specified dispense location is then adjusted relative to the found edge. While the dispensed edge is normally parallel to the edge is not required. The start and end locations of the dispense operation using this technique is less critical than the length of the line that is adjusted by the found edge.

The systems and methods further enable the accurate dispense of a line located across or to different edges. Specifically, this technique utilizes two different edges of the electronic substrate and then performs a dispense operation relative to the two edges. One example of using this technique is to dispense the center between the two edges.

The systems and methods further enable the accurate dispense of dots or line segments. Specifically, a dispensing unit of the dispensing system may be modified to dispense dots.

The systems and methods further enable the use of a vision system to measure edges of the electronic substrate with a single camera field of view or in different fields of view.

The systems and methods further enable the ends of the dispensed lines to be more accurately located by utilizing an additional edge more or less perpendicular to a dispense reference edge. Non-straight edges may be similarly dispensed although more measurement points may be required and/or dimensional information about the edge supplied.

FIG. 1 schematically illustrates a dispenser, generally indicated at 10, according to one embodiment of the present disclosure. The dispenser 10 is used to dispense a viscous material (e.g., an adhesive, encapsulent, epoxy, solder paste, underfill material, etc.) or a semi-viscous material (e.g., soldering flux, etc.) onto an electronic substrate 12, such as a printed circuit board or semiconductor wafer. The dispenser 10 may alternatively be used in other applications, such as for applying automotive gasketing material or in certain medical applications. It should be understood that references to viscous or semi-viscous materials, as used herein, are exemplary and intended to be non-limiting. The dispenser 10 includes first and second dispensing units or heads, generally indicated at 14 and 16, respectively, and a controller 18 to control the operation of the dispenser. Although two dispensing units are shown, it should be understood that one or more dispensing units may be provided.

The dispenser 10 may also include a frame 20 having a base or support 22 for supporting the substrate 12, a dispensing unit gantry 24 movably coupled to the frame 20 for supporting and moving the dispensing units 14, 16, and a weight measurement device or weigh scale 26 for weighing dispensed quantities of the viscous material, for example, as part of a calibration procedure, and providing weight data to the controller 18. A conveyor system (not shown) or other transfer mechanism, such as a walking beam may be used in the dispenser 10 to control loading and unloading of substrates to and from the dispenser. The gantry 24 can be moved using motors under the control of the controller 18 to position the dispensing units 14, 16 at predetermined locations over the substrate. The dispenser 10 may include a display unit 28 connected to the controller 18 for displaying various information to an operator. There may be an optional second controller for controlling the dispensing units.

Prior to performing a dispensing operation, as described above, the substrate, e.g., printed circuit board, must be aligned or otherwise in registration with a dispenser of the dispensing system. The dispenser further includes a vision system 30, which is coupled to a vision system gantry 32 movably coupled to the frame 20 for supporting and moving the vision system. As described, the vision system 30 is employed to verify the location of landmarks, known as fiducials, on the substrate. Once located, the controller can be programmed to manipulate the movement of one or both of the dispensing units 14, 16 to dispense material on the electronic substrate.

Systems and methods of the present disclosure are directed to aligning the substrate (e.g., circuit board) by utilizing an edge of the substrate. The description of the systems and methods provided herein reference exemplary electronic substrates (e.g., printed circuit boards), which are supported on the support 22 of the dispenser 10. However, other items may be aligned, such as an edge of a semiconductor chip. In one embodiment, the dispense operation is controlled by the controller 18, which may include a computer system configured to control material dispensers. In another embodiment, the controller 18 may be manipulated by an operator.

With reference to FIGS. 2A and 2B, a description of an exemplary system and method is provided. In particular, the relationship between an edge of the substrate found at runtime and a location at which an edge-line and/or edge-dot is dispensed will be described. FIG. 2A illustrates a substrate, generally indicated at 200, having a planar surface 202, a pair of fiducials 204, 206 represented by circles that are used to establish a "global" coordinate system, a three by three array 208 of devices, such as copper pads, each of which has a well-defined relationship to the pair of fiducials (as well as to any other devices provided on the substrate), and a feature 210, illustrated as an elongated pad in FIG. 2A. The feature 210 has a well-defined relationship to an edge 212 of the substrate 200, and a loosely defined relationship with the other features (e.g., array 208) provided on the substrate and the global fiducials.

FIG. 2B illustrates a substrate, generally indicated at 220, having a similar layout to the substrate 200 shown in FIG. 2A, but longer in length. All of the features shown and described with reference to substrate 200 of FIG. 2A are represented by the same reference numbers when describing the substrate 220 of FIG. 2B. The relationship between the fiducials 204, 206 and the devices (e.g., array 208) is unchanged and the relationship between the elongated pad 210 and the edge 212 of the substrate 220 is similarly unchanged. However, the relationship between the devices (e.g., array 208) and the elongated pad 210 has changed in that the distance is greater.

FIG. 3A shows an expanded view of the feature (e.g., elongated pad 210) on the right-hand side of the substrate, e.g., the substrate 200 shown in FIG. 2A. As shown and described below, the feature 210 may be used to define a reference-line 214, which the edge-line and the edge-dot commands (or an arc command), and in turn, may be used to determine where to dispense material onto the substrate. Each dashed box 216, 218 illustrated in FIG. 3A illustrates a field of view of a camera (not shown) of the vision system 30. With this particular example, it should be observed that the position of each field of view is such that a center pixel of the camera corresponds to a common edge along the reference-line 214. The feature edge (e.g., reference-line 214) closest to the physical edge 212 of the substrate 200 is utilized. The operator of the dispenser may desire to use the edge that exhibits the most consistent relationship to the physical edge 212 of the substrate 200. In the event that both feature edges exhibit a consistent relationship to the physical edge 212, which implies that the feature width is constant, then either edge may be selected.

FIGS. 3B and 3C illustrate enlarged views of each of the field of view (as represented by dashed boxes 216, 218 shown in FIG. 3A. These views also illustrate the established search gates. Please note that when performing the method described herein the following assumptions are made:
 the dispensed line is 1 millimeter (mm) to the left of the physical edge of the substrate (i.e., 5 mm to the right of the feature edge);
 the dispensed line extends by 2 mm in both directions (as compared to the endpoints of the reference-line);
 the dispensed line begins towards the bottom of the substrate (e.g., the front of the dispenser) and moves toward the top of the substrate (e.g., the rear of the dispenser);
 the coordinate associated with the upper field of view (e.g., the position associated with the $1^{st}$ Locate-EdgeDef command) is 88, 12; and
 the coordinate associated with the lower field of view (e.g., the position associated with the $2^{nd}$ Locate-EdgeDef command is 88, 6.

Based on these assumptions and the substrate 200 as shown in FIG. 3A, the endpoints 222, 224 of the edge-line 226 to be deposited should have a start position (e.g., x, y) of 93, 4 and an end position (e.g., x', y') of 93, 14.

Figure 4A:
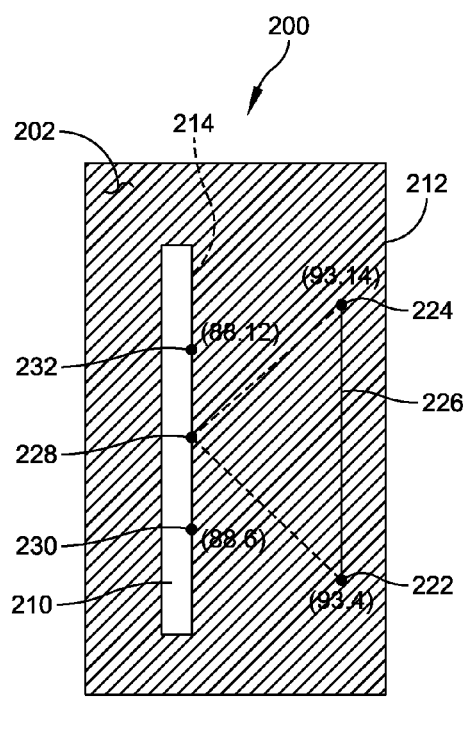
FIGS. 4A and 4B are top plan views of a portion of an exemplary substrate showing the relationships established by process-program data between a reference-line and an edge-line.

FIG. 4A illustrates the relationships established by process-program data between the reference-line 214 and the edge-line 226. Specifically, the following relationships may be established using process program data (and based on any current transformation in effect):
 a nominal angle for the reference-line 214 based on "taught" locations (in this instance 90 degrees);
 a midpoint 228 of the reference-line 214; and
 relationships (e.g., angle and vector distance) from the midpoint 228 of the reference-line 214 to the start point 222 of the edge-line 226 and the endpoint 224 of the edge-line.

Figure 4B:
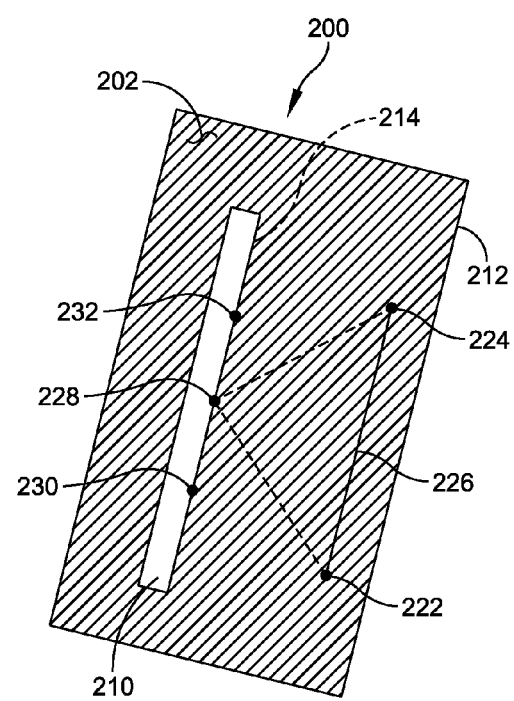

FIG. 4B illustrates how these relationships are applied during a dispensing operation. Specifically, at runtime, the following actions are performed:
 establish the endpoints 230, 232 of the reference-line 214 using a pair of Locate-EdgeDef commands;
 based on these endpoints 230, 232, the following is determined
  the delta angle of the reference-line 214 (e.g., the current reference-line angle minus the original reference-line angle, which may be −15 degrees), and
  the (runtime) midpoint 228 of the reference-line 214; and from the (runtime) midpoint 228, the location of each endpoint 222, 224 of the edge-line is projected by using the (unchanged) vector distance from the midpoint 228 to the edge-line endpoint 222 or 224 in question, and the original angle (from midpoint to endpoint) adjusted by the delta angle.

Based on the foregoing, a dispense operation may be performed to dispense the feature. However, there may be instances in which a horizontal (rather than vertical) feature is to be dispensed. During such instances in which a vertical feature or a horizontal feature is desired, there is a constraint to find only half of the coordinate pair (e.g., an x-axis position when searching for vertical features and a y-axis position when searching for horizontal features).

With this constraint in mind, at runtime, in one embodiment, the following method is performed:

move to the position defined by the Locate-EdgeDef command;

acquire an image;

if searching for a vertical edge or edges, then
  search for the edge of interest along the center row of the image, and
  return a value indicating a y-axis offset of zero (0), which is interpreted as the y-axis location that is exactly as expected, and an x-axis offset that reflects where the edge of interest intersected that y-axis location; and if searching for a horizontal edge or edges, then
  search for the edge of interest along the center column of the image, and
  return a value indicating a x-axis offset of zero (0), which is interpreted as the x-axis location that is exactly as expected, and an y-axis offset that reflects where the edge of interest intersected that x-axis location.

Based on the approach just described, there are some issues to be considered. For example, assuming an angle of the reference-line 214 at runtime closely minors an angle when the program was taught, then the pair of found points may be offset by a similar amount (in either the x-axis or the y-axis direction). This, in turn, results in the (runtime) reference-line 214 being an expected vector length and with a reasonable midpoint 228 (from which to project the edge-line endpoints). As noted, with the absence of information to positively identify a point along both axes the reference-line established at runtime will still have some ability to slide along the overall feature edge.

If, on the other hand, the reference-line 214 is rotated (as in FIG. 4B), as compared to the angle when taught, the methodology is somewhat complicated. For example, assuming that the point of rotation happened to be the exact midpoint of the reference-line 214, which is unlikely, then each of the found edge points would appear to move closer to or farther from the midpoint 228 by an equidistant amount. In this instance, the computed (runtime) midpoint 228 is correct. In a more likely instance, the point of rotation is something other than the midpoint 228 of the reference-line 214. Barring the possibility that one of the reference-line endpoints 230, 232 corresponds to the point of rotation, then both points will move closer to or farther from the midpoint 228 of the reference line but not by an equidistant amount. This effect is due to the fact that the edge-line endpoints 222, 224 are referenced from the midpoint 228 of the reference-line 214, which tends to average out any error to some extent.

The foregoing is premised on consistent features that are conducive to accurately finding an edge of interest and have a well-defined relationship to the edge of the substrate or some other area of interest.

Figure 5A:
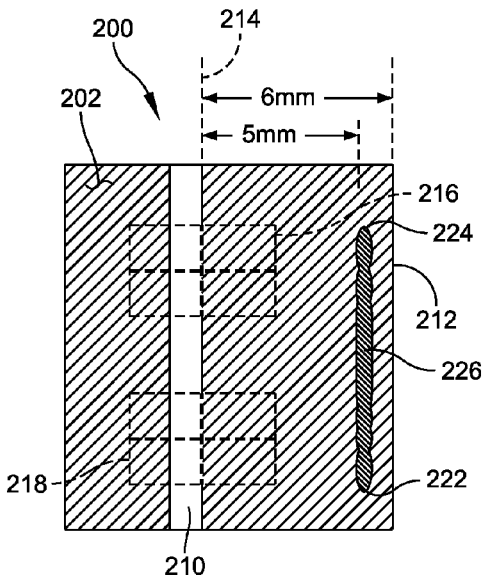
FIGS. 5A, 5B, 5C and 5D are enlarged top plan views of a portion of the electronic substrate illustrated in FIG. 2A showing relationships between a feature and an edge of the electronic substrate.

FIG. 5A illustrates a partial view of FIG. 3A, which is referenced as well. As described, the program is defined such that the dispenser 10 dispenses the edge-line 226 five millimeters (5 mm) to the right of reference-line 214. Assuming that the reference-edge 214 is six millimeters (6 mm) from the edge 212 of the substrate 200, then a center of the dispensed line 226 is a desired one millimeter (1 mm) in from the edge of the substrate 200.

Figure 5B:
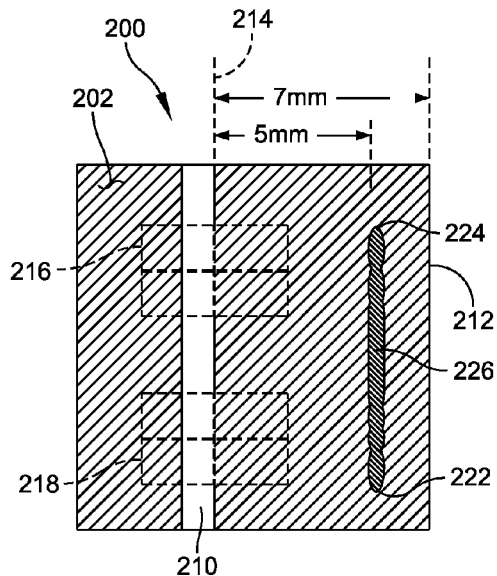

FIG. 5B illustrates a situation in which the relationship between the edges of the vertical feature 210 and the edge 212 of the substrate 200 is not consistent. In this situation, an offset from the reference-line 214 to the dispensed line 226 is exactly as specified but the goal of dispensing one millimeter (1 mm) from the physical edge 212 will not have been met.

Figure 5C:
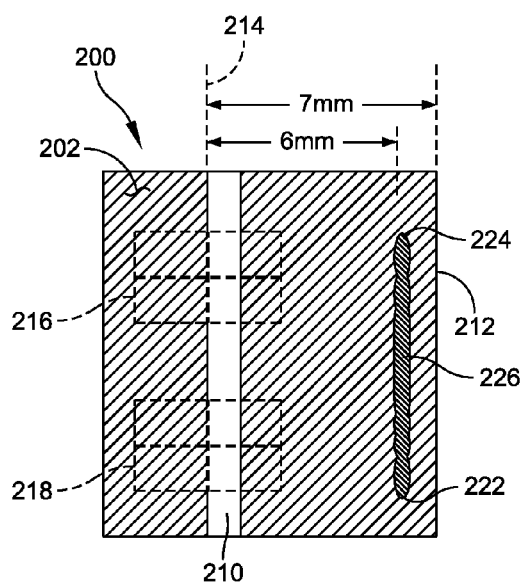
Figure 5D:
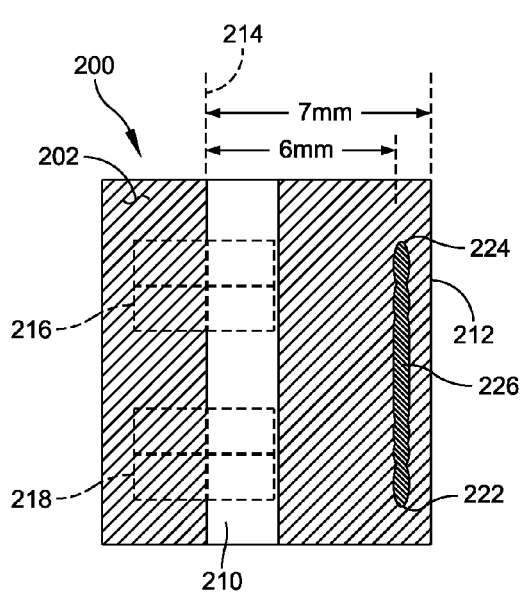

FIGS. 5C and 5D illustrate another situation in which the relationship between the inner (e.g., left) edge of the feature 210 and the edge 212 of the substrate 200 is constant, but the width of the feature can vary.

FIG. 6A illustrates a portion of FIG. 4A, which is referenced as well. FIG. 6B illustrates a situation in which the feature 210 is degraded at 234 or otherwise imperfect to the point where the two edge points 230, 232 are found when employing the vision system 30. When this occurs, the bad point 234 (runtime) of the reference-line 214 is skewed in relationship with a true edge of the feature 210, which in turn results in an edge-line 226 that does not properly track the edge 212 of the substrate 200.

FIG. 6C illustrates the same degraded feature 234 shown in FIG. 6B. However, it is assumed that the edge point 232 is somehow adjusted downward to land on a good portion of the feature 210. The problem with this solution is that the dispensed line 226 is shifted down thus introducing a y-axis error, as depicted by a horizontal dashed line 236 that spans FIGS. 6A, 6B and 6C.

Another aspect of the disclosure is directed to a system and method to locate an edge, which can be referred to as a locate-edge command feature. The locate-edge command may be used to enable an operator to dispense edge-lines and edge-dots that track a found edge. To achieve this feature, the locate-edge command is taught in pairs, with a second command function immediately following a first command function. All edge-lines and edge-dots following the locate-edge commands have their positions modified by the found position of the edge. When teaching the locate-edge command, an operator aligns the reference edge being taught with the center of the field of view. The operator then adjusts a gate defining the region of interest to encompass the edges, which will be within the search region. The gate can also encompass edges that are not of interest.

Figure 7:
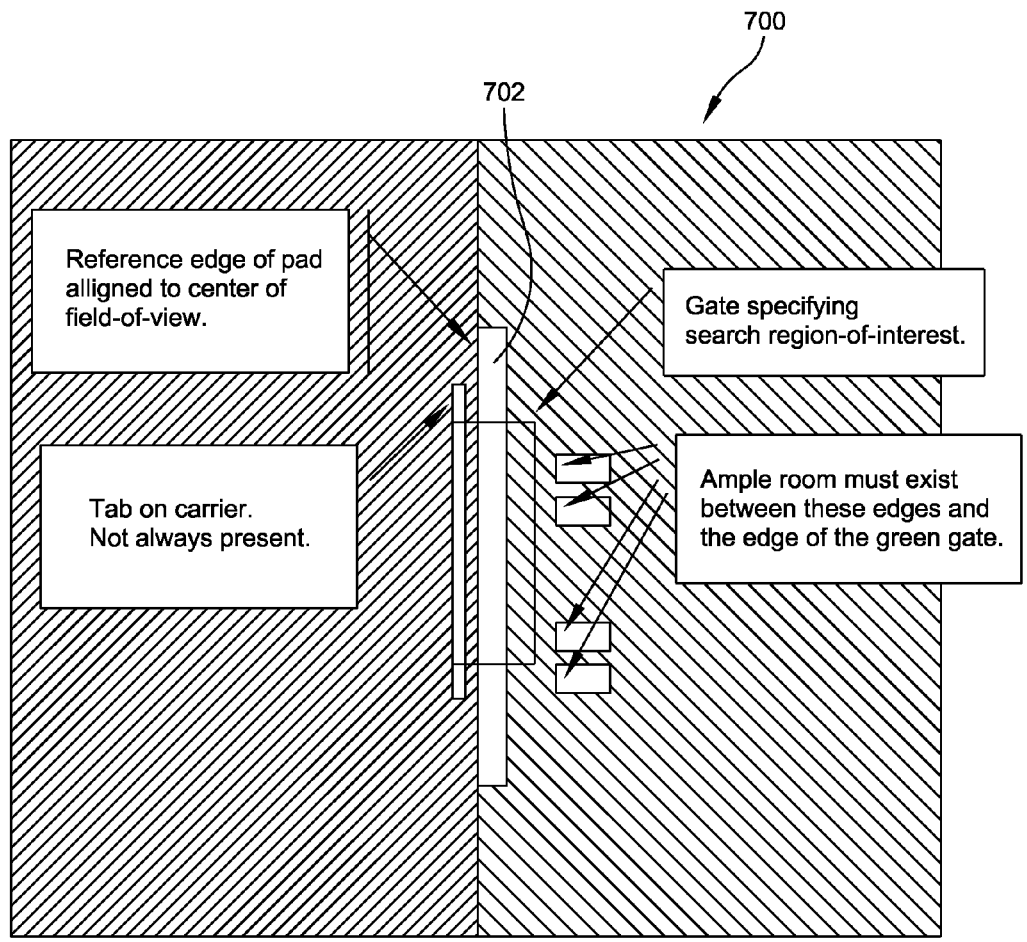
FIG. 7 is an enlarged top plan view of a portion of an exemplary electronic substrate showing a locate-edge feature.

For example, FIG. 7 illustrates a substrate 700 having a pad 702. As shown, a left edge of a pad is the reference edge, and therefore aligned to the center of the field of view. However, because the right edge of the pad is in such close proximity to the left edge of the pad, it is included in the region of interest. A gate is adjusted such that both the left and the right edges of the pad are within the search area. Ample room should be provided so that the edges from components that are not of interest are not contained within the region of interest. For this example, the operator can select the edge as being type "Right Edge 2" (second edge in from the left-hand edge). If it can be guaranteed that no edges are found to the left, then the operator can select the edge to be "Left Edge 1" (first edge in from the left). However, features provided on the substrate may sometimes be present outside the edge of interest to prohibit this selection. Any edges found to the left of the reference edge are ignored. For this example, the found edges from right to left would be as follows—right edge of pad, left edge of pad, right edge of tab, and left edge of tab. The controller would select the left edge of the pad as the "Right Edge 2," which is the second edge from the right.

Figure 8:
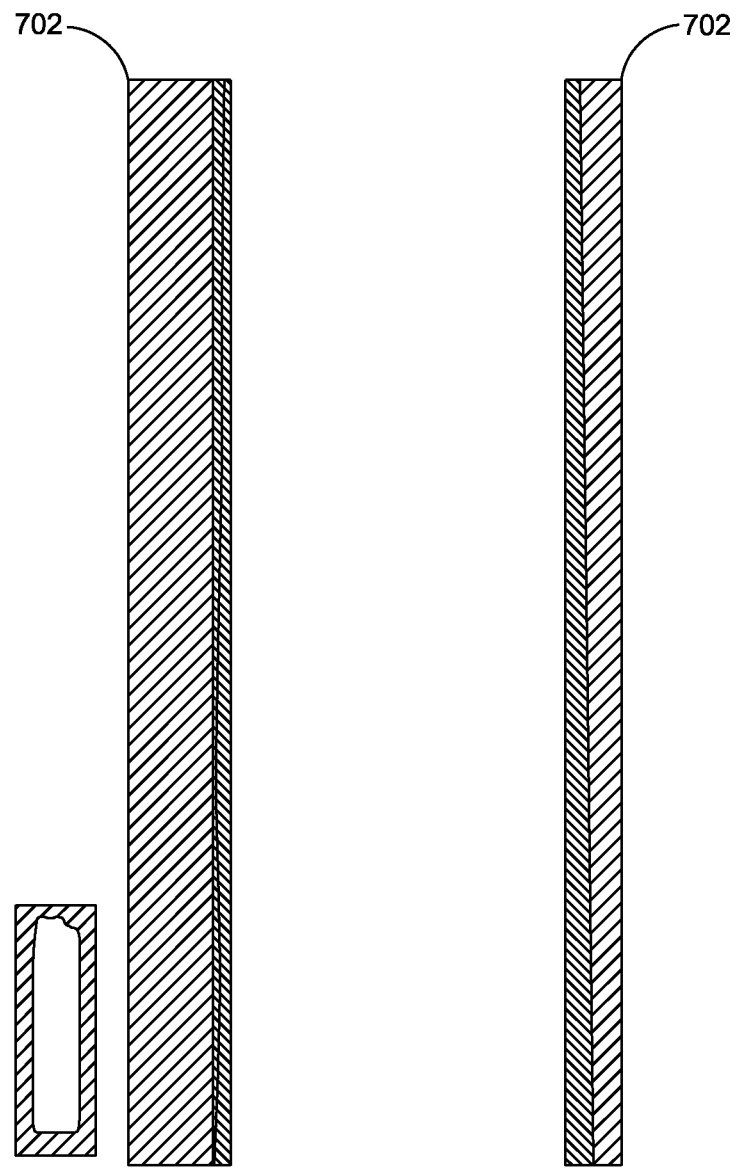
FIG. 8 is a side view of a pad having defined edges and an enlarged side view of the pad.

The controller may be programmed to detect pad edges that use a change in brightness to determine the location of an edge. Specifically, controller in cooperation with the vision system may select a change from dark background to bright foreground. The edge position is determined as the location where there is a maximum change in brightness. FIG. 8 illustrates the pad 702 shown in FIG. 7. The left-hand side of FIG. 8 illustrates the pad 702 with very well-defined vertical edges. The right-hand side of FIG. 8 illustrates an enlarged section of the same pad 702. From the enlarged view, it is shown that the edge transition actually occurs over several pixels. The found edge locations (maximum change in brightness) are shown.

Each edge of a sub-region is assigned a strength value, which is a measure of how well defined an edge is. Clearly, defined edges that run from both sides of the region of interest have a high value. Faint or broken edges have a reduced score. A threshold is determined from empirical testing, which exclude weak or broken edges that are less than one-third of their expected vale. This allows for some level of contamination.

Figure 9:
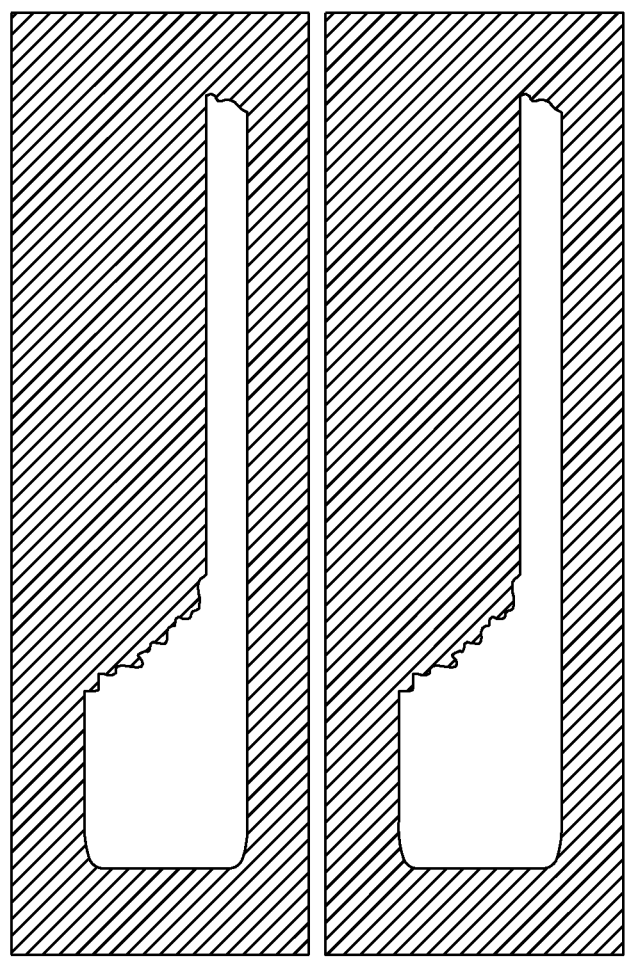
FIG. 9 illustrates two images of a pad that is partially routed.

Consider the pad image illustrated in FIG. 9, which indicates the issue with the pads that are partly routed, giving them a scalloped effect. The controller in cooperation with the vision system is programmed to detect three lines, which are shown on the right-hand image of FIG. 9. If selecting "Right Edge 2," the middle edge would be the reference edge.

Figure 10:
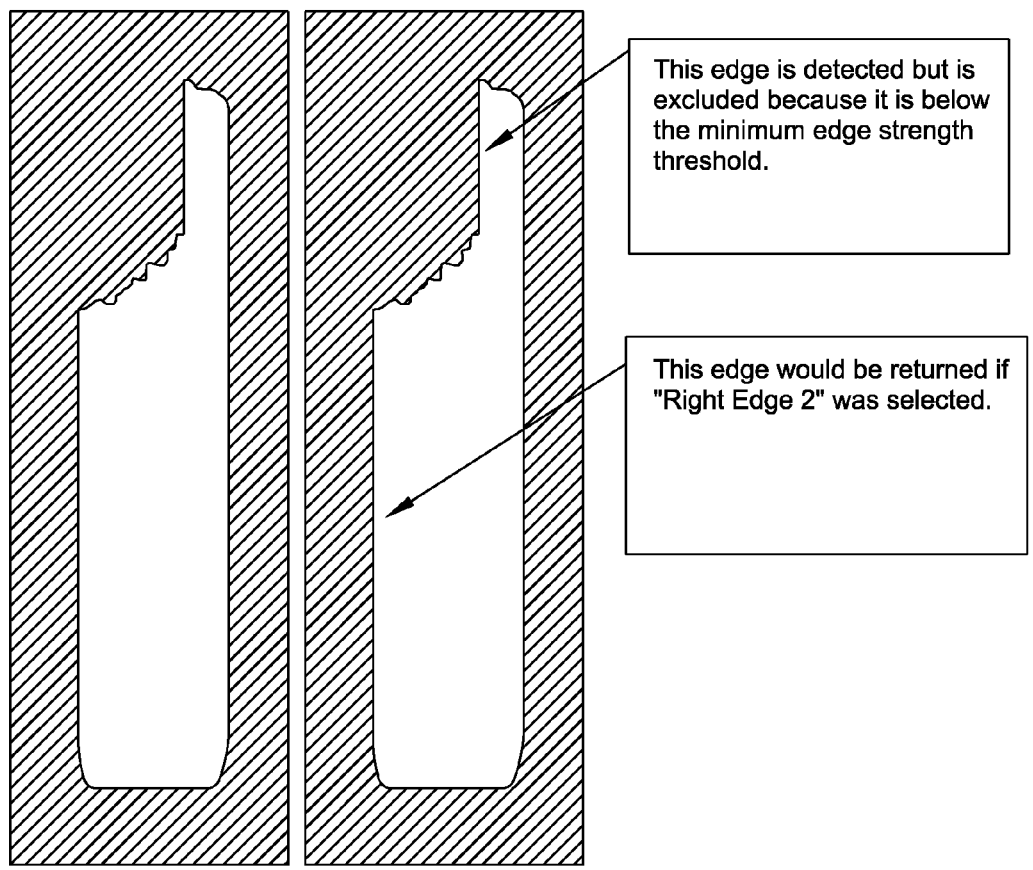
FIG. 10 illustrates two images of a pad that is partially routed but less so than the pad shown in FIG. 9.

In FIG. 10, a partially scalloped pad is shown. However, the majority of the pad is not routed. Three lines are still detected, with the middle line being below the minimum strength, and thus will not be used. "Right Edge 2" in this case would yield the left most line or edge.

Figure 11A:
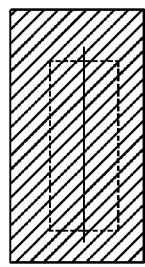
FIGS. 11A, 11B and 11C are schematic views of an edge, two found edges, and a selected reference edge, respectfully.
Figure 11B:
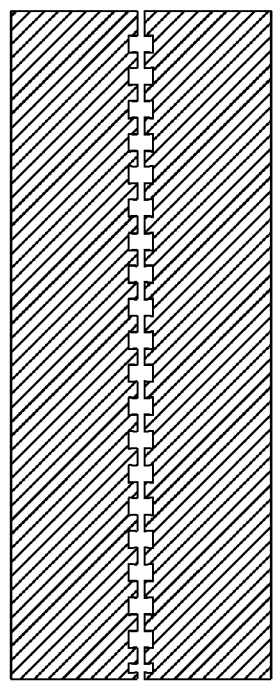
Figure 11C:
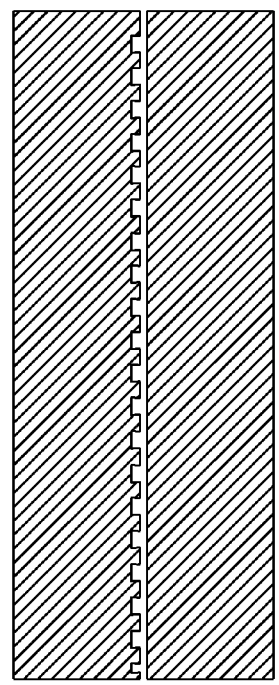

To test the minimum edge width capability of the edge detection system and method, a synthetic image may be created with a one-pixel wide line drawn in it. This image is passed into the edge detection process to determine if it could successfully find the edges. The process finds both the left-hand and the right-hand edges. FIG. 11A illustrates the edge as taught. FIG. 11B illustrates the two edges found (as indicated by dashed lines). FIG. 11C illustrates the reference edge selected (i.e., "Right Edge 2").

Individual detection edges used while performing methods of the present disclosure may be achieved by utilizing a camera and image processing software, a laser probe, a mechanical probe, or any other suitable device.

A single edge may be determined using two or more locations. Alternatively, a pair of edges may be detected with dispensing being located relative to both sets of edges.

The computer system may include an operating system that manages at least a portion of the hardware elements included in the computer system. Usually, a processor or controller executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating system available from various sources. Many other operating systems may be used, and the embodiments disclosed herein are not intended to be limited to any particular implementation.

The processor and operating system together define a computer platform for which application programs in high level programming languages may be written. These component applications may be executable, intermediate, for example, C-, bytecode or interpreted code which communicates over a communication network, for example, the Internet, using a communication protocol, for example, TCP/IP. Similarly, aspects in accord with the present disclosure may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accordance with the present disclosure may be implemented in a non-programmed environment, for example, documents created in HTML, XML or other format that, when viewed in a window of a browser program, render aspects of a graphical-user interface or perform other functions. Further, various embodiments in accord with the present disclosure may be implemented as programmed or non-programmed elements, or any combination thereof. For example, a web page may be implemented using HTML while a data object called from within the web page may be written in C++. Thus, the disclosure is not limited to a specific programming language and any suitable programming language could also be used.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of depositing material on an electronic substrate with a dispensing system of the type including a frame, a dispensing unit gantry movably coupled to the frame, a dispensing unit coupled to the dispensing unit gantry, the dispensing unit being configured to deposit material onto the substrate during the dispense operation, a vision system gantry coupled to the frame, and a vision system coupled to the vision system gantry, the vision system being configured to obtain one or more images of the electronic substrate prior to performing the dispense operation, the method comprising:

manipulating the vision system with the vision gantry system to move to the position defined by a feature;

acquiring an image of at least a portion of the feature, to search for an edge of the portion of the feature;

returning a value indicating an offset of zero (0) at the edge of the feature or an x-axis offset at a distance from the edge of the feature; and dispensing a line of material along the edge of the feature based on the value indicating the offset of zero (0) or the x-axis offset, wherein acquiring the image of at least the portion of the feature includes acquiring a first field of view image of at least a first portion of the feature and acquiring a second field of view image of at least a second portion of the feature, wherein returning the value includes returning a first value indicating a first offset of zero (0) at the edge of the feature or a first x-axis offset at a distance from the edge of the feature based on the first image and a second value indicating a second offset of zero (0) at the edge of the feature or a second x-axis offset at a distance from the edge of the feature based on the second image.

2. The method of claim 1, wherein an edge of the feature defines a reference-line based on the first value and the second value, which is used to determine where to dispense material onto the substrate.

3. The method of claim 1, wherein a center pixel of the first field of view image and a center pixel of the second field of view image corresponds to a common edge along the reference-line with a first offset of zero (0) and a second offset of zero (0).

* * * * *